United States Patent [19]

Gevas et al.

[11] Patent Number: 5,226,220
[45] Date of Patent: Jul. 13, 1993

[54] METHOD OF MAKING A STRAIN RELIEF FOR MAGNETIC DEVICE LEAD WIRES

[75] Inventors: Nicholas J. Gevas, South Bend, Ind.; David W. Behnke, Berrien Springs, Mich.

[73] Assignee: Allied-Signal Inc., Morristown, N.J.

[21] Appl. No.: 811,158

[22] Filed: Dec. 19, 1991

[51] Int. Cl.⁵ ............................................. H01F 41/10
[52] U.S. Cl. ..................................... 29/605; 29/602.1; 264/272.19; 336/96; 336/192
[58] Field of Search ............... 29/605, 602.1; 264/254, 264/272.19; 336/192, 96; 439/736; 174/86, 178

[56] References Cited

U.S. PATENT DOCUMENTS

| | | | |
|---|---|---|---|
| 3,376,536 | 4/1968 | Bloom | 336/192 |
| 3,430,174 | 2/1969 | Kogo et al. | 336/192 X |
| 3,609,630 | 9/1971 | Francis | 439/736 X |
| 3,860,896 | 1/1975 | Van Der Hoek | 264/272.19 |
| 4,803,777 | 2/1989 | Nakagawa et al. | 336/192 X |

Primary Examiner—Carl E. Hall
Attorney, Agent, or Firm—Leo H. McCormick, Jr.; Larry J. Palguta; Robert A. Walsh

[57] ABSTRACT

A method of providing an electrical connection to a coil of wire in an encapsulated magnetic device of the type having one length of wire formed in a coil about a core and disposed within a relatively rigid encapsulating material is disclosed. The method includes providing a lead wire to be connected to the length of wire and extend from the encapsulated magnetic device for connection to other electrical circuitry and bending that lead wire into and "S" shape in a region near where the lead wire is to exit the magnetic device. The typically rigid encapsulating material is excluded from a region surrounding the region of the bend by filling the region with an elastomer so that the lead wire may experience movement within the device. The elastomer may be a room temperature vulcanizable material.

1 Claim, 2 Drawing Sheets

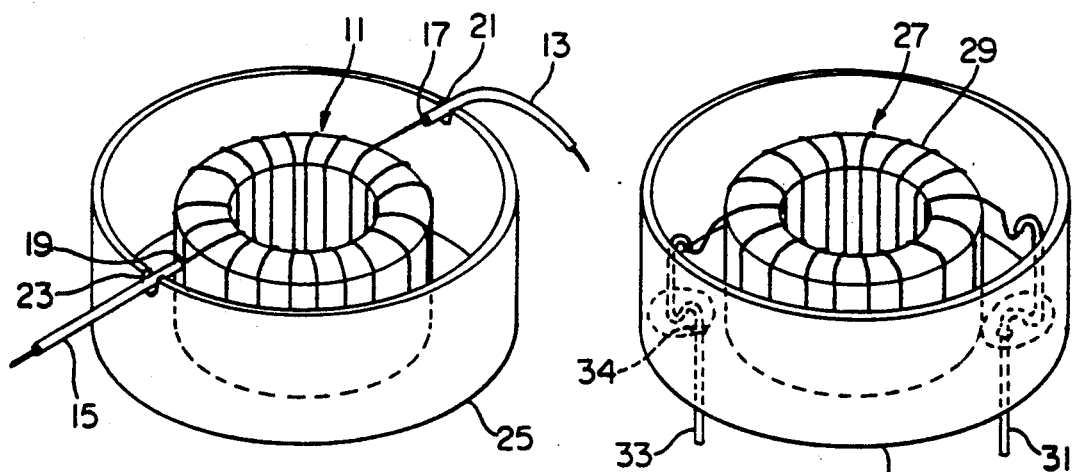
FIG. 1 PRIOR ART
FIG. 2
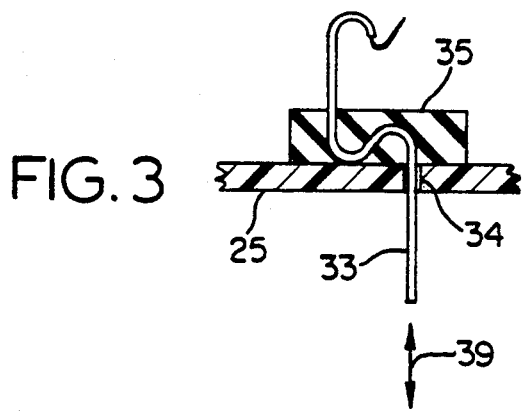
FIG. 3
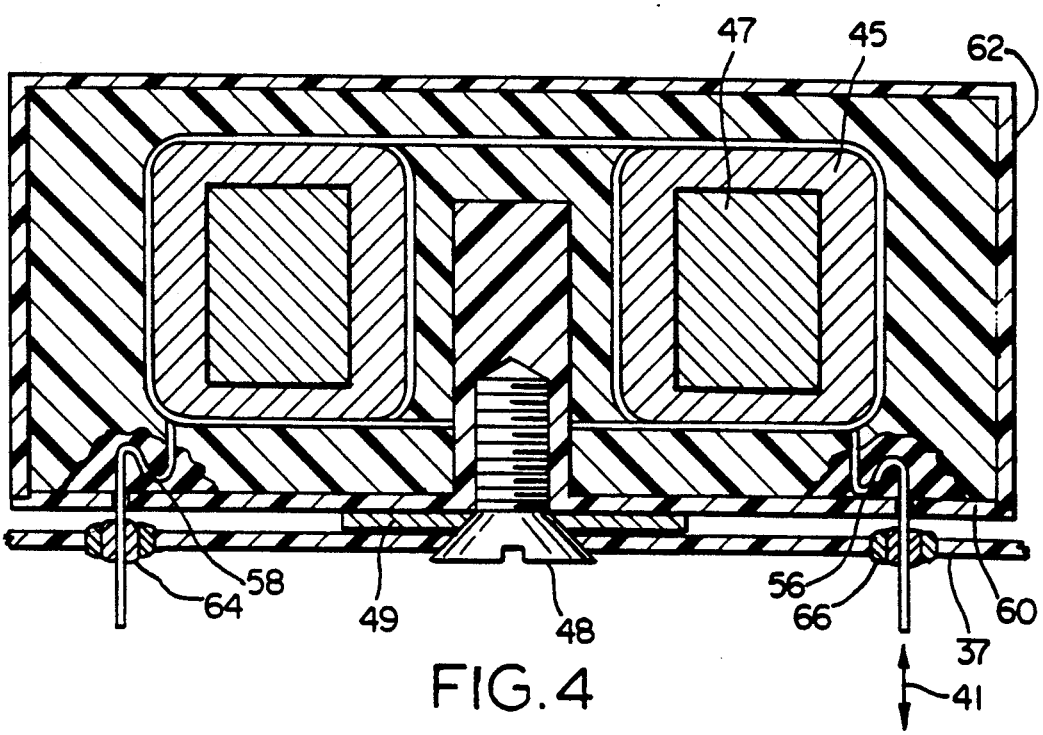
FIG. 4

METHOD OF MAKING A STRAIN RELIEF FOR MAGNETIC DEVICE LEAD WIRES

SUMMARY OF THE INVENTION

The present invention relates generally to the art of connecting electrical components to printed wiring boards and more particularly to a technique for plugging relatively heavy inductive devices into plated thru-holes in printed circuit boards and heat sink assemblies.

Frequently, relatively small electrical components such as resistors and small capacitors are supported on printed wiring boards or other chassis solely by their electrical leads. However, magnetic devices, particularly those having a ferromagnetic (typically soft iron) cores are typically too heavy for such mounting techniques without having provisions for reducing stress on the PWB solder pads when subject to thermal gradients, vibration and shock.

It is commonplace for inductive devices as well as other electrical components to be "potted" in containers filled with epoxy resin with their lead wires exiting directly from that potting material. Such materials are relatively rigid and do not allow for lead movement to compensate for thermal gradients, vibration or accelerated shock.

Among the several objectives of the present invention may be noted the provision of an improved termination technique for indicative devices; the provision of a method of forming potted coils with lead wires extending therefrom which are capable of some flexing at the point of exiting the encapsulated coil; and the provision of a coil encapsulating or potting technique which prevents the potting material from gripping the lead wire by surrounding a portion of that lead wire with a resilient material before potting thereby allowing movement between the lead wire, the encapsulated coil and the solder pad on the printed wiring board assembly. These as well as other objects and advantageous features of the present invention will be in part apparent and in part pointed out hereinafter.

In general, a method of making a magnetic device includes winding a length of wire about a ferromagnetic core to form a coil thereabout and then providing electrical lead wires for connecting the coil to an external circuit. At least one, and preferably all of the lead wires are formed along a preselected length thereof to create an "S" type section and effectively diminish its overall length. The coil is then connected to its respective lead wires and surrounded along with portions of those connected lead wires with an epoxy resin by placing the core and surrounding coil in a container with an epoxy resin potting material which will solidify into a relatively rigid material and protect the coil from moisture and mechanical damage. The resin is excluded from a region which includes the "S" type formed preselected length by filling that region with a resilient material such as an RTV (Room Temperature Vulcanizable) material.

Also in general and in one form of the invention, a magnetic device potted in a relatively rigid resin material and having a plurality of lead wires extending therefrom for mechanical support as well as electrical connection with those lead wires to be soldered into plated-through holes on a printed wiring board that has the lead wires formed with a serpentine section near the point where the lead wire exits the device. That serpentine section is immersed in a flexible elastomer instead of the epoxy resin to allow some movement of the lead wire into and out of the device. The elastomer preferably is a room temperature vulcanizable material and the serpentine pattern is formed by bending the lead wire into an "S" shape or "shepherd's crook".

BRIEF DESCRIPTION OF THE DRAWING

FIG. 1 illustrates the prior art technique of connecting a pair of lead wires to a potted coil;

FIG. 2 is a view of a coil similar to the one in FIG. 1, but showing the lead wire forming technique of the present invention;

FIG. 3 shows a serpentine pattern bend in one of the lead wires from FIG. 2;

FIG. 4 is a cross-sectional view of a coil where the coil wire also functions as the lead wire coupled to a printed circuit board;

Corresponding reference characters indicate corresponding parts throughout the several views of the drawing.

Figure 5:
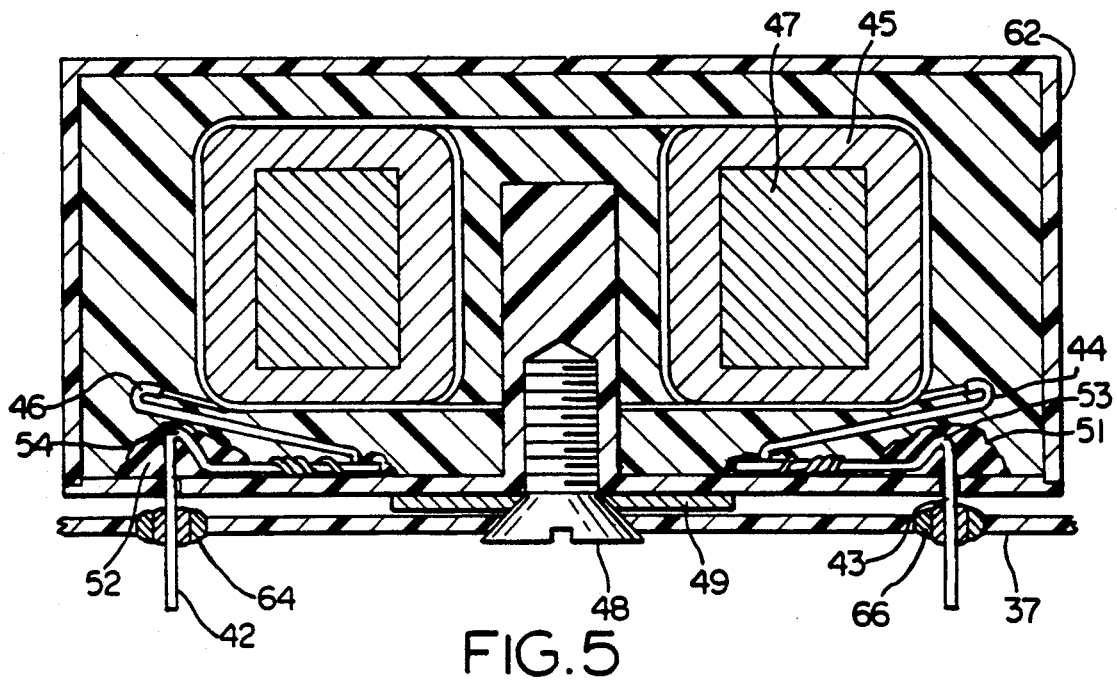
FIG. 5 is a cross-sectional view of a coil assembly with the coil wire joined to a heavier gauge lead wire which is in turn coupled to a printed circuit board.

The exemplifications set out herein illustrate a preferred embodiment of the invention in one form thereof and such exemplifications are not to be construed as limiting the scope of the disclosure or the scope of the invention in any manner.

DESCRIPTION OF THE PREFERRED EMBODIMENT

In FIG. 1, a coil 11 has been formed about a toroidal ferromagnetic core and the coil ends soldered or crimped to lead wires 13 and 15 at 17 and 19 respectively. Notches 21 and 23 are formed in the lip of a cup or container 25 to receive the leads and the cup is then completely filled with an epoxy resin. In the structure described in FIG. 1, the only flexing allowed is in the lead wires 13 and 15 and is in regions outside the cup 25.

In FIG. 2, a quite different condition prevails. Again a coil 27 has been formed about a toroidal core 29 and coil wires 13 and 15 have been connected to the ends of lead wire 31 and 33. This time, however, lead wire 33 exits the bottom of the cup 25 through a hole 34. Near where it exits the cup, the lead wire 33 is bent into a serpentine shape such as the "S" configuration shown. Preferably, the other lead wire 31 is similarly bent into an "S" shape and exits the bottom of the cup through a hole 34'. An elastomer such as a room temperature vulcanizable material (RTV) (similar to conventional bath tub caulk) is placed over the exit hole and around the portions of the lead wires 31 and 33 with the "S" bend. Thereafter, when an epoxy fills the cup 25, it is excluded from the region occupied by the elastomer about the lead wires. The region occupied by the flexible elastomer is shown by reference numeral 35 in FIG. 3. FIG. 3 also shows that the lead wire 33 has been reformed into an "S" shaped serpentine pattern within the region now occupied by the flexible elastomer 35. The combination of the "S" bend immersed in the flexible elastomer allows some of the lead wire to deflect into or out of the hole along its length (in the direction of the arrows 39 and 41 of FIGS. 3 and 4 respectively)

to compensate for thermally induced changes and vibration when anchored by screw 48 to a printed circuit card 37 shown in FIG. 4.

In FIG. 5, a coil 45 has been formed about ferromagnetic core 47 with coil wire leads 44 and 46 extending therefrom. Coil leads 44 and 46 are connected to a pair of somewhat greater diameter bus wires 43 and 42 which extend from the potted coil structure. A printed wiring board heat sink 49 is interposed between the assembly and the printed wiring board 37. The potted assembly 62 may be held in place by one or more screws such as 48. A serpentine bend 53 in the bus wire 43 (54 in 42) is surrounded by a resilient material 51 or 52 allowing the same longitudinal movement as discussed in conjunction with FIGS. 2 and 3. In each case, a serpentine bend, "S" bend, or other fold in the lead wire exceeds ninety degrees. The primary difference between the devices of FIGS. 2 and 5 is that the device of FIG. 5 is formed and integrated underneath the coil assembly 45 while the device of FIG. 2 is laterally outside the coil assembly. The advantage of the device of FIG. 5 resides in its more compact outside diameter which takes up less board area and allows for more density in the printed wiring board design. In FIGS. 4 and 5, like components bear like reference numerals. FIGS. 4 and 5 differ in that the coil wire, e.g., a 20 gauge wire, also becomes and is formed to be the lead wires in FIG. 4 while in FIG. 5, the lead wires, again for example, 20 gauge wire, are joined (soldered, twisted, crimped or otherwise spliced) to the coil wires which are this time a finer wire such as 26-28 gauge. In FIG. 4, the coil wire leads are formed into an "S" shape at 56 and 58. These leads extend through the bottom 60 of coil enclosure 62, through the printed wiring board 37 and into pads 64 and 66. Of course the lead wires are to be soldered directly to conductive strips on the printed wiring board thru normal process of electrically attachment known as "flow soldering".

Figure 6:
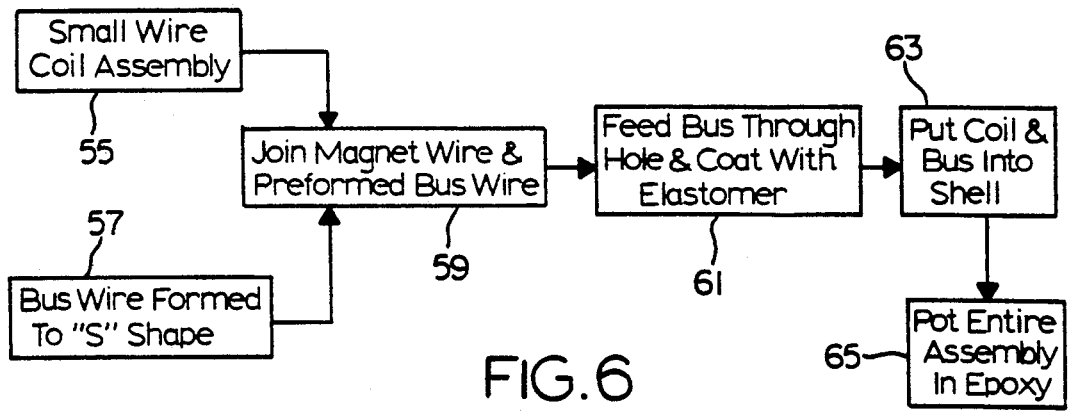
FIG. 6 is a block diagram outlining the process of making the coil assembly of FIG. 5.

The method of making the potted coil or other encapsulated electrical component with lead wires which flex within the device should now be clear. In FIG. 6, the process of fabricating the coil assembly of FIG. 5 includes preforming electrical lead wires for connecting the component to an external circuit into an "S" or similar resilient shape at 55. During step 55, typically all of the lead wires are preformed along a preselected length thereof to effectively diminish its overall length either by the "S" shape of FIG. 3 or the loop of FIG. 5. Those lead wires are then connected with the component from source 55 by soldering as shown at 59. The coil and leads are then encapsulated by surrounding the component and portions of its connected lead wires with an epoxy resin, being careful, however to exclude the resin from a region which includes the preformed preselected length. This is accomplished by passing the lead wires through their respective holes in base 60 and applying the resilient material or elastomer to the region of the bends as at 61 and thereafter placing the coil, leads and elastomer into the shell 62 as at 63. Finally, the remaining portion of the cup or shell 62 is filled with an epoxy resin as at 65.

Figure 7:
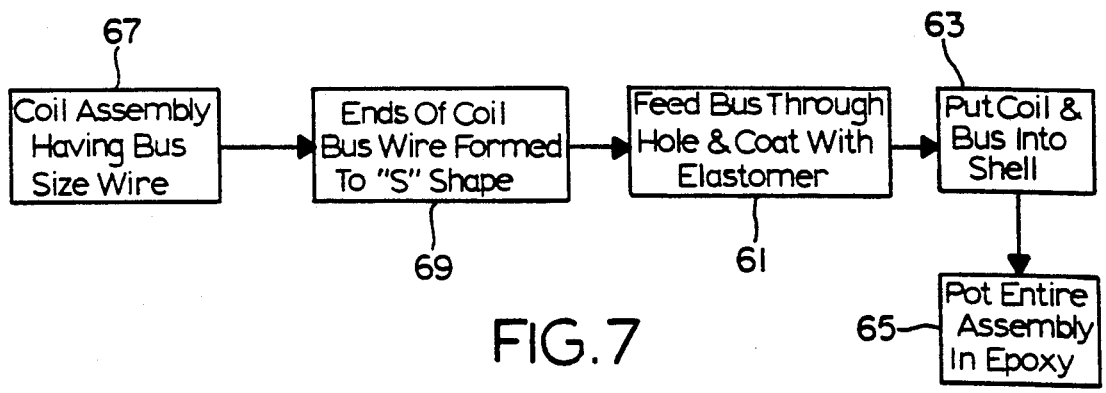
FIG. 7 is a block diagram outlining the process of making the coil assembly of FIG. 4.

FIG. 7 describes the technique for forming the coil assembly of FIG. 4. As in the case of FIG. 6, the resilient material is a room temperature vulcanizable elastomer. The coil with lead wires extending therefrom is provided at 67 and those lead wires are bent at 69 into some circuitous pattern so that some axial freedom is allowed. The latter parts of the processes may be the same as indicated by like reference numerals. In either case, the exclusion of the epoxy resin from the region of the bends is performed by the elastomer and provides major portion of the lead wire deflection in the vertical direction.

From the foregoing, it is now apparent that a novel lead manufacturing technique has been disclosed meeting the objects and advantageous features set out hereinbefore as well as others, and that numerous modifications as to the precise shapes and other details may be made by those having ordinary skill in the art without departing from the spirit of the invention or the scope thereof as set out by the claims which follow.

What is claimed is:

1. A method of making an electronic component having leads adapted to be plugged into plated through-holes in a printed circuit board, comprising the steps of:
   winding a length of wire about a ferromagnetic core to form a coil thereabout, said length of wire having first and second ends;
   forming a first lead wire with a straight section connected to an "S" turn section;
   connecting said first lead wire to said first end of said length of wire;
   forming a second lead wire with a straight section connected to an "S" turn section;
   connecting said second lead wire to said second end of said length of wire
   placing said coil with the first and second lead wires attached thereto into a cavity in a housing;
   locating said straight section of said first lead wire in a first opening in said housing;
   locating said straight section of said second lead wire in a second opening in said housing;
   locating the "S" turn sections of both the first and second lead wires inside the housing cavity;
   covering at least said "S" turn sections of said first and second lead wires with a room temperature vulcanizable elastomer, said elastomer allowing said straight sections to move perpendicularly with respect to said housing to compensate for thermal gradients, vibration and acceleration shock induced on the electronic component;
   allowing said elastomer to cure;
   filling said cavity with an epoxy resin to encapsulate said coil and the elastomer covered "S" turn sections; and
   curing said epoxy to form a solid a rigid material to protect the coil from moisture and mechanical damage.

* * * * *